(12) United States Patent
Hall et al.

(10) Patent No.: US 10,205,421 B2
(45) Date of Patent: Feb. 12, 2019

(54) PHOTOVOLTAIC MODULAR SYSTEM

(71) Applicants: David R. Hall, Provo, UT (US); Austin Carlson, Provo, UT (US); Seth Myer, Provo, UT (US)

(72) Inventors: David R. Hall, Provo, UT (US); Austin Carlson, Provo, UT (US); Seth Myer, Provo, UT (US)

(73) Assignee: Hall Labs LL, Provo, UT (US)

( * ) Notice: Subject to any disclaimer, the term of this patent is extended or adjusted under 35 U.S.C. 154(b) by 85 days.

(21) Appl. No.: 15/261,160

(22) Filed: Sep. 9, 2016

(65) Prior Publication Data
US 2018/0076762 A1  Mar. 15, 2018

(51) Int. Cl.
| | |
|---|---|
| H02S 40/36 | (2014.01) |
| H02S 40/30 | (2014.01) |
| H02S 20/26 | (2014.01) |
| H02S 20/30 | (2014.01) |
| H01L 31/048 | (2014.01) |
| H02J 3/38 | (2006.01) |
| H02J 3/46 | (2006.01) |

(52) U.S. Cl.
CPC ............ *H02S 40/36* (2014.12); *H01L 31/048* (2013.01); *H02J 3/383* (2013.01); *H02J 3/46* (2013.01); *H02S 20/26* (2014.12); *H02S 20/30* (2014.12); *H02S 40/30* (2014.12)

(58) Field of Classification Search
CPC .......... H02S 40/30; H02S 40/36; H02S 20/26; H02S 20/30; H01L 31/48; H02J 3/383; H02J 3/46

USPC ......................................................... 136/246
See application file for complete search history.

(56) References Cited

U.S. PATENT DOCUMENTS

| | | | |
|---|---|---|---|
| 2010/0275534 A1* | 11/2010 | Ruskin ...................... | E04D 1/26 52/173.3 |
| 2011/0030761 A1* | 2/2011 | Kalkanoglu .............. | E04D 5/12 136/245 |
| 2012/0152469 A1* | 6/2012 | Choi ........................ | E06B 9/264 160/127 |
| 2013/0206213 A1* | 8/2013 | He .......................... | H01L 31/048 136/251 |
| 2015/0096607 A1* | 4/2015 | Yong ....................... | H01L 31/05 136/244 |
| 2015/0101761 A1* | 4/2015 | Moslehi .................. | F24J 2/0422 160/107 |

* cited by examiner

*Primary Examiner* — Matthew T Martin

(57) ABSTRACT

A photovoltaic modular system is disclosed. One or more photovoltaic (PV) modules are connected together with embedded parallel wiring that facilitates the sharing of power from a plurality of PV modules to power one or more electrical devices. Control electronics within each individual PV module allows the isolation of PV modules that are shaded or otherwise not productive. No external connecting wiring, or devices are required to make the system functional. All wiring, connectors and electronics are integral and embedded within each individual PV module. The PV modules have adhesive on the back to allow them to be installed without additional mounting hardware. All PV module system components are completely encapsulated together in one modular component.

15 Claims, 16 Drawing Sheets

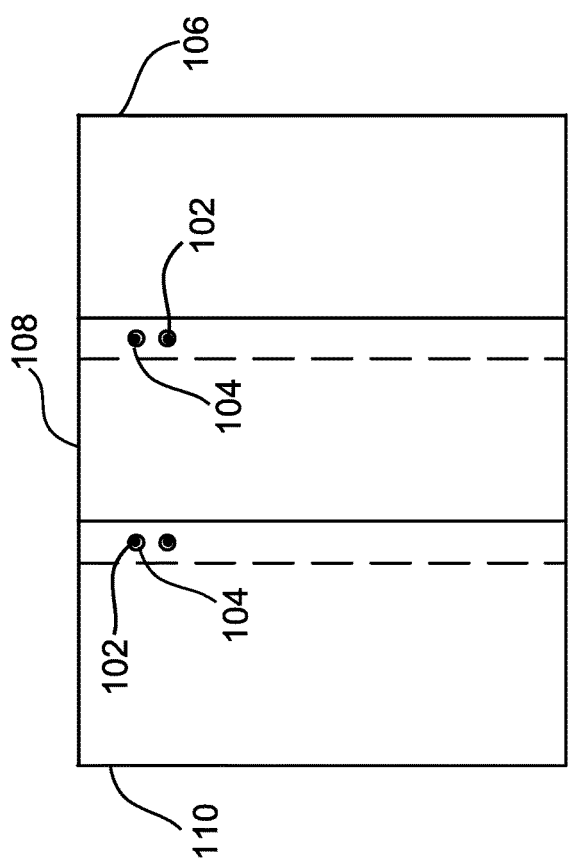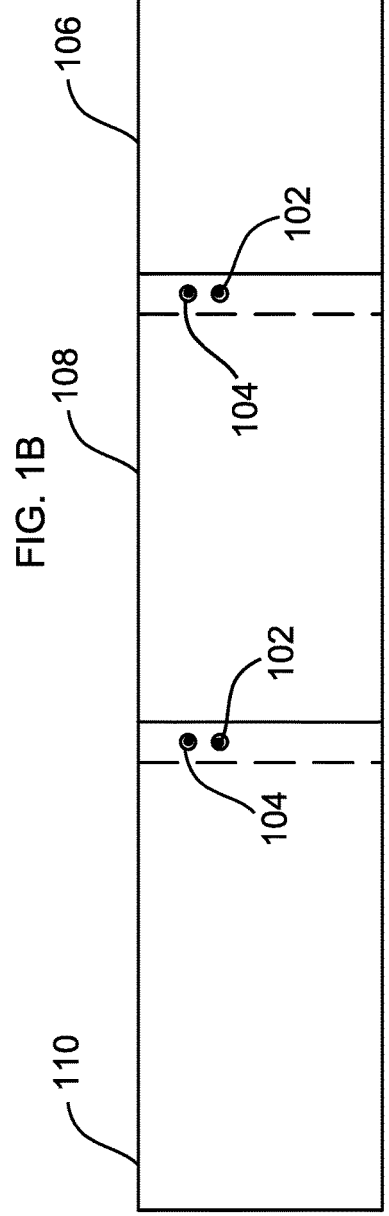

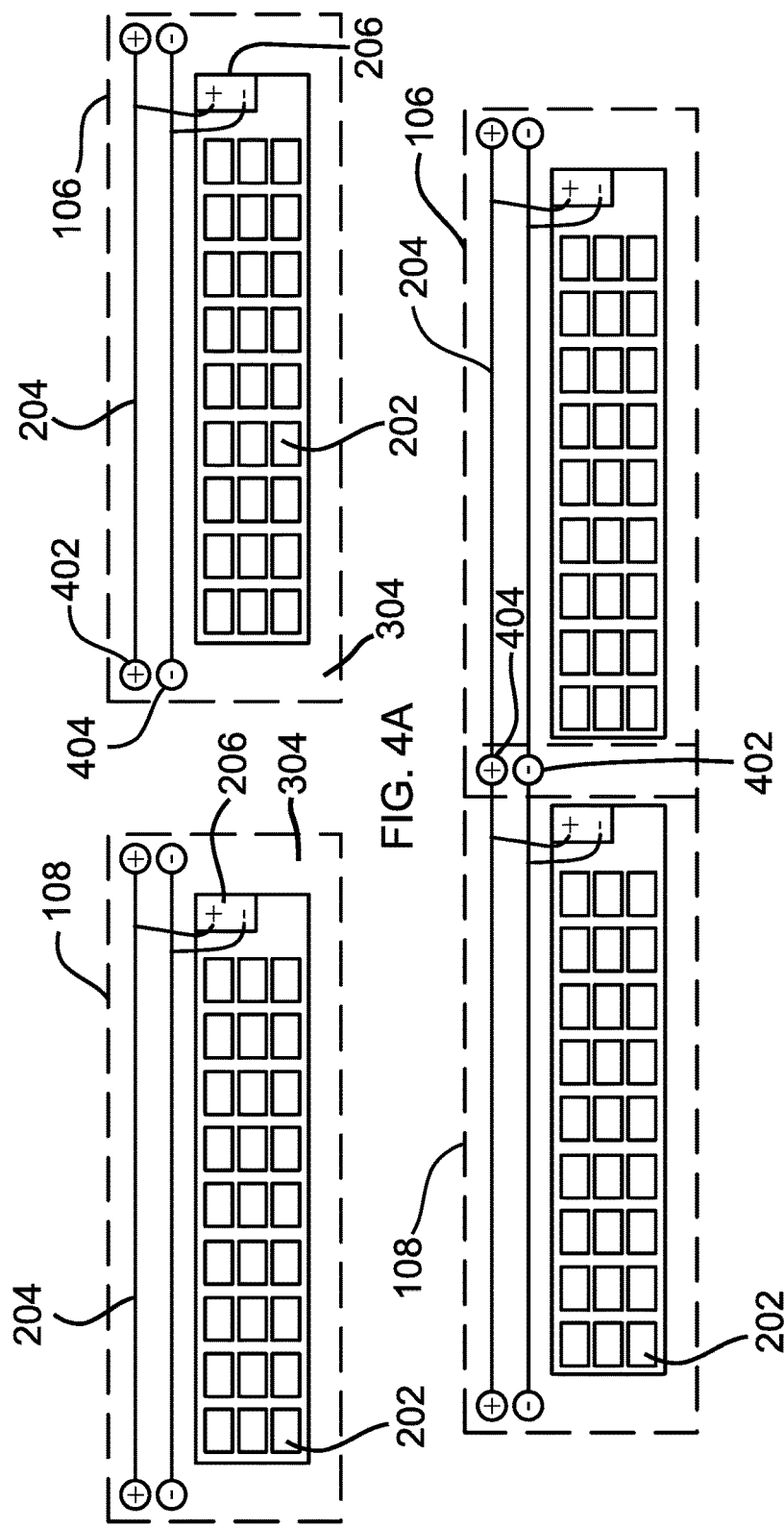

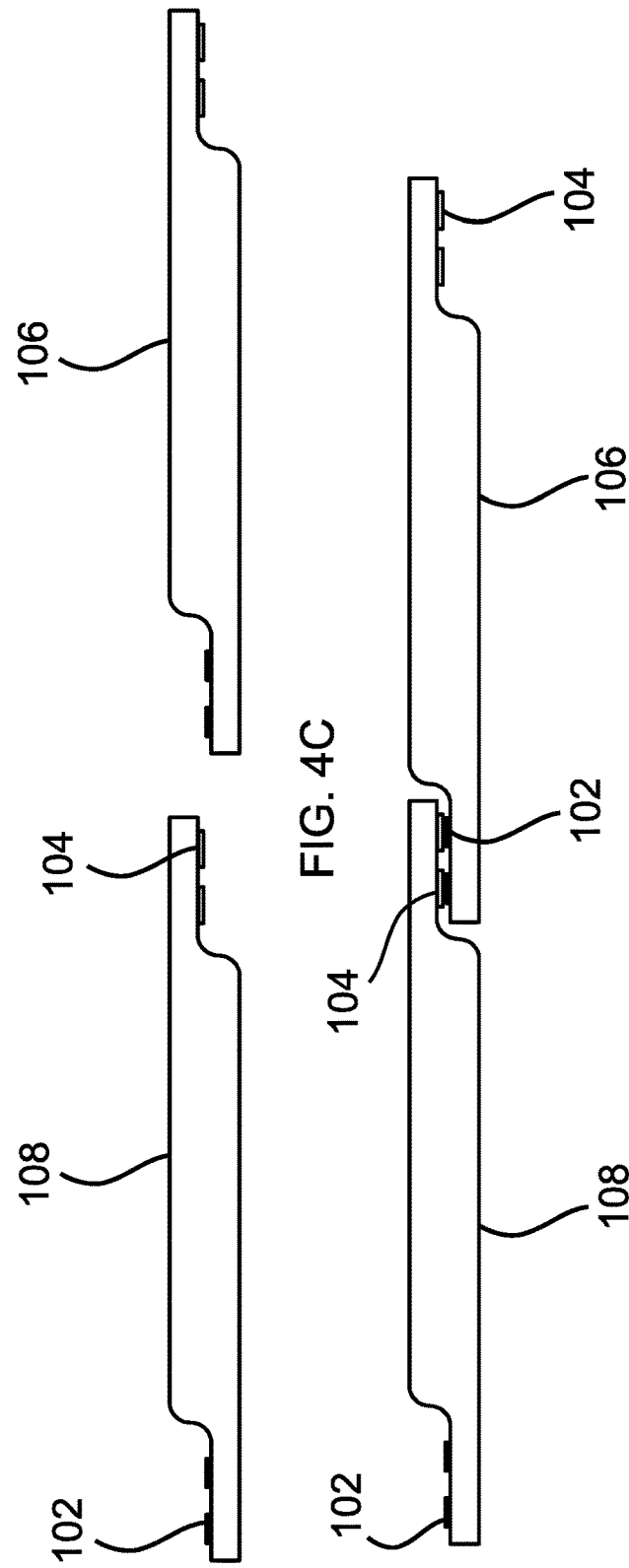

PHOTOVOLTAIC MODULAR SYSTEM

BACKGROUND

Field of the Invention

This invention relates to modular photovoltaic systems.

Background of the Invention

Solar power systems are typically mounted in a location facing the sun in order to maximize the exposure to solar energy. However, there can be obstructions to the direct sunlight needed to power the solar panels. Clouds, trees, and architectural features or building elements can cause shading. Even partial shading of the solar panel can dramatically reduce the power output since the electron flow inside the panel is in series. Shading of only one section or portion of the solar panel will block the flow for the entire panel or group of panels.

Traditional solar power systems normally include multiple solar panels that are connected to each other by either parallel or series wiring (or a combination of both).

Prior to the introduction of microinverters, most if not all solar power systems were wired in series, having several "strings" of panels (a group of many panels, circuited in series), with each string feeding into a large power inverter that converted the DC power to AC power. The main disadvantage of this design is the fact that if there is shading on even one single panel within the string, it affects the current flow of that entire string (because they are wired in series), and reduces the total string power output to the lowest electrical current flow restriction created by the shading of that one panel.

By wiring the system in a parallel configuration, this problem can be solved. The parallel wired systems typically invert the DC power to AC at each individual solar panel via a microinverter. This parallel wired microinverter configuration allows each individual solar panel to operate independently, and contribute its portion of power production to the overall power of the combined system without restricting the current flow. If there is shading on one single panel, the lower power production of that panel does not restrict the total power production of the parallel string.

Many approaches to making solar power systems "modular" or easily expandable have been proposed in order to simplify the installation of the system. A large portion of these consist of unique mounting systems that attach to the roof, and connection techniques that allow multiple solar modules or panels to be connected together. The attachment system usually has some kind of rack or structure that first attaches to the roof or building structure, then the solar panels are mechanically attached to that support structure.

Some of the proposed modular systems incorporate parallel wiring along with microinverters that parallel with each other in order to interface with an AC system connected to the utility. However, they convert it to AC before performing the paralleling function. The parallel wiring is not typically incorporated within each individual module. The parallel wiring that connects multiple solar modules is normally run separate from the module in a protected cabling, raceway or electrical bus structure. Also, the electronics that perform the paralleling function are typically in a separate enclosure such as a microinverter, device or component with requisite wires connecting it to the rest of the system. The interconnecting wiring is cut to length for the specific application or configuration.

The described solar power systems are typically for large solar panels rather than smaller modules, and do not integrate the parallel wiring into the individual modules. Smaller surface areas (for example architectural features such as long narrow linear building fascias, columns or window frames) cannot accommodate these larger format solar panels.

In summary, the key advantages posited for the photovoltaic modular system include a system that:

incorporates the parallel wiring into each individual module, is in a smaller format that can fit on a variety of surfaces, even ones that are narrow or small, allows the modules to be directly connected together without the need for additional interconnecting wiring, has embedded wiring which allows the modules to be arranged in any configuration, with pairs of module connectors on all four sides of the module, performs the paralleling function on the DC side prior to converting to AC, incorporates the control electronics for the paralleling function inside each module, has a higher resolution for isolating sections of the system that are shaded by incorporating a group of smaller modules rather than one large module, can adjust to fit both smaller surface areas and be extended to longer areas by adding more modules, and can be directly attached to a smooth surface area without any other separate support structure.

SUMMARY

This invention has been developed in response to the present state of the art and, in particular, in response to the problems and needs in the art that have not yet been fully solved by currently available systems and methods. Features and advantages of different embodiments of the invention will become more fully apparent from the following description and appended claims, or may be learned by practice of the invention as set forth hereinafter.

Consistent with the foregoing, a photovoltaic modular system is disclosed which simplifies the installation of, improves the shade tolerance and power production of solar power systems.

By providing a segmented approach, multiple solar modules can be connected in parallel in order to isolate individual solar modules that are being shaded from the rest of the solar array. In this design (parallel rather than series), each solar module that receives enough light will contribute to the total power generated by the group. Shaded modules will not interrupt the current generated by the productive panels since they are electrically isolated when not producing.

Each solar module produces the same voltage, and the current they produce is additive to the current flowing through the system produced by all of the solar modules in parallel.

This design also allows the system to be expandable in the future, if and when additional power is required. As additional solar modules are added, the voltage remains the same and the current increases which provides the increased power capacity.

Another advantage of this system is the ability to adjust the overall size of the system to fit the dimensions of the available surface area. With the segmented approach, the number of solar modules can be adjusted to fit the length required.

The aesthetics of having the solar on a long continuous surface is also improved by allowing an entire linear surface to be covered with the solar element rather than having visual breaks in the solar.

It will be readily understood that the components of the present invention, as generally described and illustrated in the Figures herein, may be arranged and designed in a wide variety of different configurations. Thus, the following more detailed description of the embodiments of the invention is not intended to limit the scope of the invention, as claimed, but is merely representative of certain examples of presently contemplated embodiments in accordance with the invention. The presently described embodiments will be best understood by reference to the claims and drawings.

Certain embodiments of the invented photovoltaic (PV) modular system include: one or more photovoltaic (PV) modules, each PV module including: one or more photovoltaic cells; two or more module connectors, wherein the module connectors physically couple the one or more PV modules together; embedded parallel wiring running along one side of a PV module directly adjacent to the one or more photovoltaic cells in the main body of the PV module continuously from the two or more modular connectors on one end of the module to the two or more modular connectors on the opposite end of the module, wherein the embedded parallel wiring serves as a pathway for a total combined electrical current of the one or more PV modules connected together.

The one or more PV modules further including control electronics that isolate nonproductive PV modules from the one or more PV modules connected together in a system, allowing the combined current to pass through without diminishing the overall power production of the one or more PV modules; the control electronics modulate the power output of the one or more PV modules during periods of shading or lower power production to provide a power contribution to the total power output of the one or more PV modules.

Each PV module is enclosed in an encapsulation material, enclosing the one or more photovoltaic cells, the two or more module connectors, the embedded parallel wiring, and the control electronics.

The PV modular system, wherein the one or more photovoltaic cells, embedded parallel wiring, control electronics, and modular connectors facilitate the interconnection of additional PV modules to increase the total system power output, the increase of total surface area covered, and the connection to and isolation from a group of interconnected one or more PV modules.

The PV modular system, wherein the embedded parallel wiring is rated to handle the combined electrical current of all of the interconnected one or more PV modules. The PV modular system, wherein the one or more PV modules are connecting and providing power to one or more electrical components. The PV modular system, wherein the one or more electrical components comprises a system for charging energy storage devices or components.

The PV modular system, wherein the one or more PV modules are attached to a window covering system, and the one or more PV modules are integrated into window covering components at the time of manufacture of a window covering system. The PV modules integrated into window covering wherein the one or more PV modules are mounted to both the front and back of blind slats within the window covering system, and connect to and provide power to one or more electrical components via flexible electrical wiring that clips onto the support and control string between blind slats.

The PV modules integrated into window covering wherein the one or more PV modules are provided with a mounting system connecting to the headrail of the window covering system that suspends the one or more PV modules at a lower level where they will receive more exposure to the sun, and wherein the mounting system is adjustable, allowing the PV modules to slide either up towards the headrail or down lower where they will receive more exposure to the sun, locking in to the correct position after being properly adjusted.

The PV modular system, wherein one or more PV modules each has a full power rating of the parallel wiring equal to or greater than a sum of maximum power production of a combined interconnected PV module assembly, electronic controls of the voltage and current of each PV module are incorporated into each PV module's internal circuiting, and the embedded parallel wiring within the one or more PV modules provides an electrical pathway for both power and control functions.

The PV modular system, comprising peel and stick adhesive backing to allow the one or more PV modules to be adhered to a surface, and wherein the one or more PV modules each comprises an extended encapsulation material allowing multiple one or more PV modules to overlap and not cover or shade any active solar portion of adjacent one or more PV modules.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 1B is a top view of three vertical PV modules that are connected together.

FIG. 1C is a top view of three horizontal PV modules that are connected together.

FIG. 4A is a top view of two PV modules prior to being connected.

FIG. 4B is a top view of two PV modules that are connected.

FIG. 4C is a side view of two PV modules prior to being connected.

FIG. 4D is a side view of two PV modules that are connected together.

DETAILED DESCRIPTION OF THE DRAWINGS

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1A:
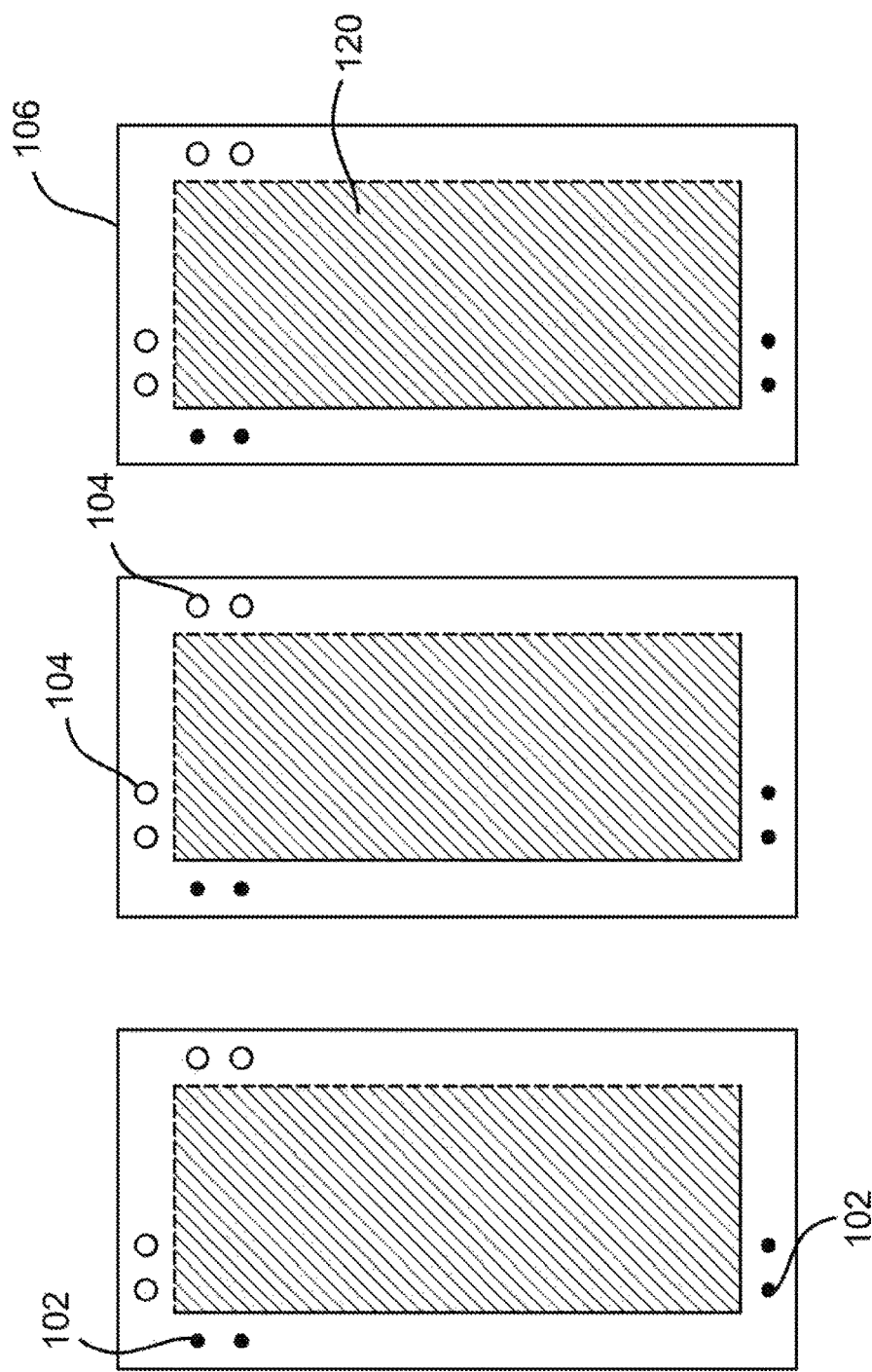
FIG. 1A is a top view of three PV modules before they are connected together.

FIG. 1A is an illustration of one example of the PV modular system comprising three PV modules. The drawing 100 shows a top view of three PV modules before they are connected together. The module connectors 102 on the top of the PV module are designed to connect to the module connectors 104 on the bottom of an adjacent PV module. Each PV module 106 is fully functional without any other modules connected to it.

FIG. 1B illustrates how three vertical PV modules are connected. PV module 106 is connected to two additional PV modules. The secondary PV module 108 overlaps the PV module 106 and the electrical connection at the interface is made by the contact of top module connector 102 of PV module 106 with bottom module connector 104 of PV module 108. The third PV module 110 is connected in the same manner. These connections make the embedded parallel wiring continuous across all three connected PV modules, allowing the current to flow from all productive PV modules to provide power the connected electrical components.

FIG. 1C illustrates how three horizontal PV modules are connected. A PV module 106 is connected to two additional PV modules. The secondary PV module 108 overlaps the PV module 106 and the electrical connection at the interface is made by the contact of top module connector 102 of PV module 106 with bottom module connector 104 of PV module 108. The third PV module 110 is connected in the same manner. These connections make the embedded parallel wiring continuous across all three connected PV modules, allowing the current to flow from all productive PV modules to provide power the connected electrical components.

Figure 2:
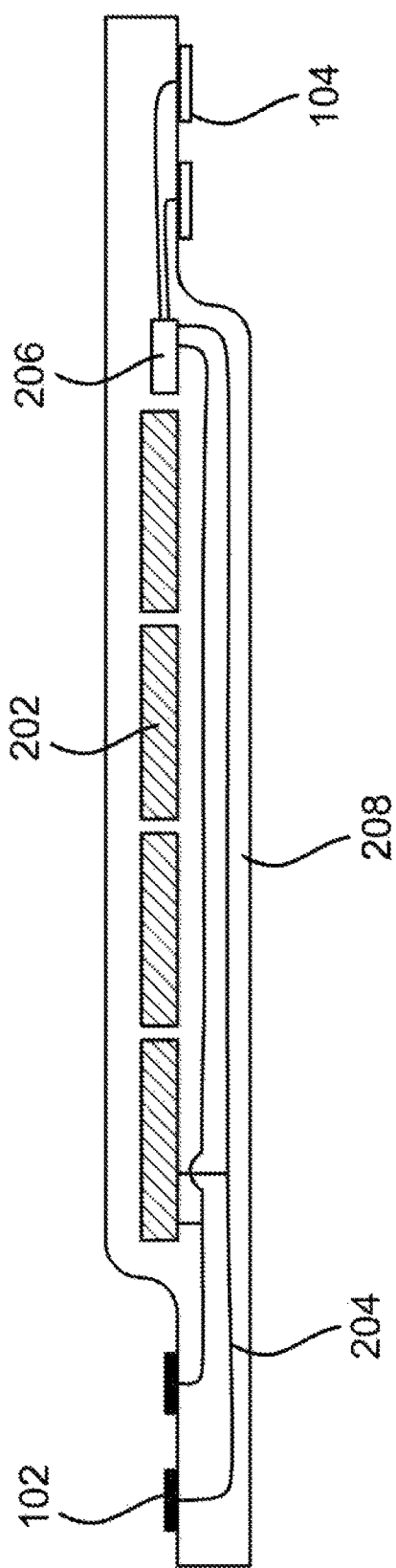
FIG. 2 is a cross section of a PV module showing the internal components.

FIG. 2 is a cross section of a PV module showing the internal components. Photovoltaic cells 202 are arranged at the top of the PV module facing up and interconnected electrically. Module connectors 102 are mounted on the top of the PV module. Module connectors 104 are mounted on the bottom of the PV module. Embedded parallel wiring 204 connects to modular connectors 102 and module connectors 104, to photovoltaic cells 202 and to control electronics 206. The encapsulation material 208 completely encapsulates all of the components, integrating them into one complete encapsulated assembly.

Figure 3A:
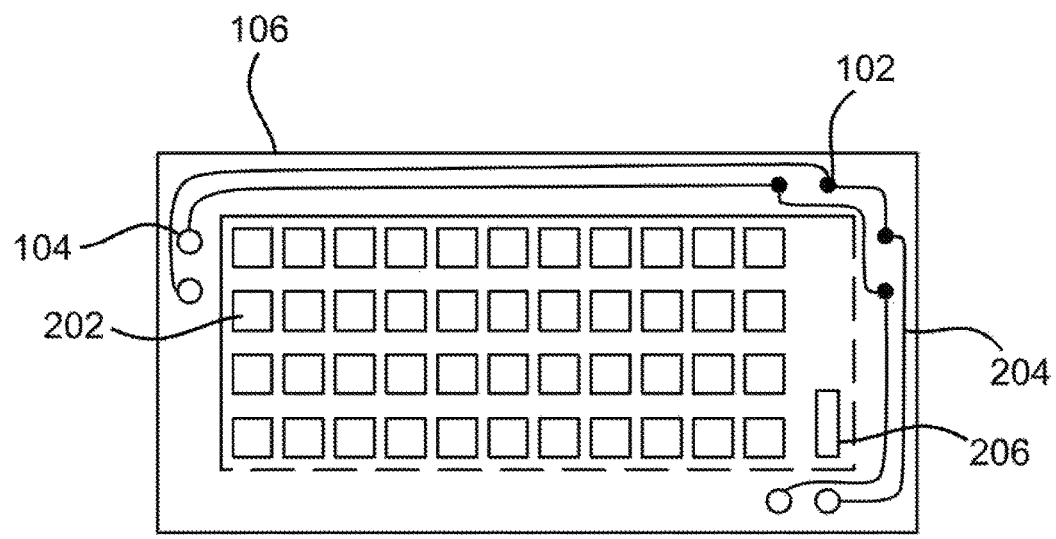
FIG. 3A is a top view of a PV module showing the internal components.

FIG. 3A is a top view of a PV module showing the internal components. Photovoltaic cells 202 are arranged at the top of the PV module facing up and interconnected electrically. Module connectors 102 are mounted on the top of the PV module. Module connectors 104 are mounted on the bottom of the PV module. Embedded parallel wiring 204 connects to modular connectors 102 and module connectors 104 and to the interconnected photovoltaic cells 202 and to control electronics 206.

Figure 3B:
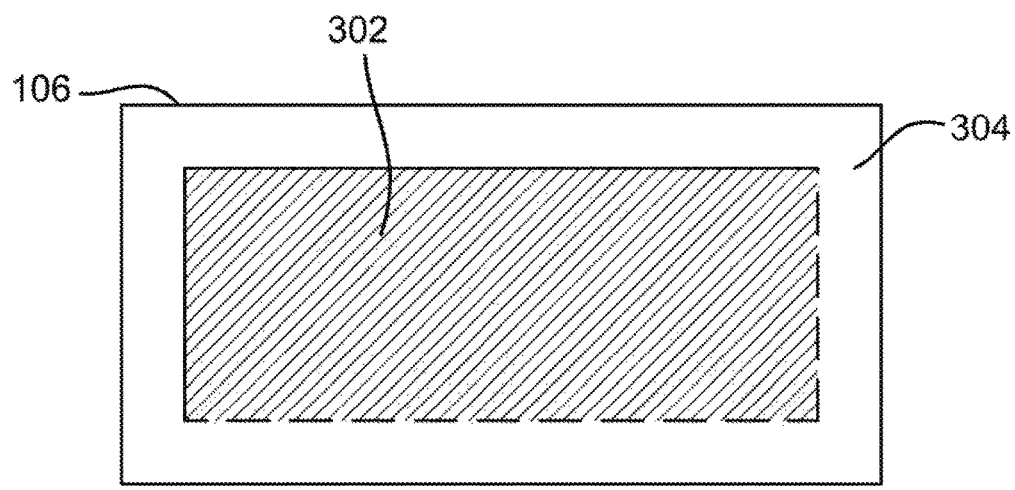
FIG. 3B is a top view of a PV module showing the overlap area for interfacing with an adjacent PV module.

FIG. 3B is a top view of a PV module 106 showing the overlap area for interfacing with an adjacent PV module. The active solar area 302 of the PV module consists of the photovoltaic cells. The outer perimeter 304 of the PV module can be overlapped by adjacent PV modules without covering the active solar area 302.

FIG. 4A is a top view of two PV modules prior to being connected. PV module 106 is designed to fit with adjacent PV module 108 and is shown with positive 402 and negative 404 modular connectors. The embedded parallel wiring 204 connects to the interconnected photovoltaic cells 202 and extends the circuiting from PV module 106 to PV module 108 via the control electronics 206.

FIG. 4B is a top view of PV modules that are connected. PV module 106 is overlapping adjacent PV module 108 and is showing the positive 402 and negative 404 modular connectors connected together. The embedded parallel wiring 204 connects to the interconnected photovoltaic cells 202 and extends the circuiting from PV module 106 to PV module 108 via the control electronics 206.

FIG. 4C is a side view of two PV modules prior to being connected. PV module 106 is designed to fit with adjacent PV module 108 and is shown with top modular connectors 102 and bottom modular connectors 104.

FIG. 4D is a side view of two PV modules that are connected together. PV module 106 is overlapping adjacent PV module 108 and is shown with top modular connectors 102 and bottom modular connectors 104.

Figure 5:
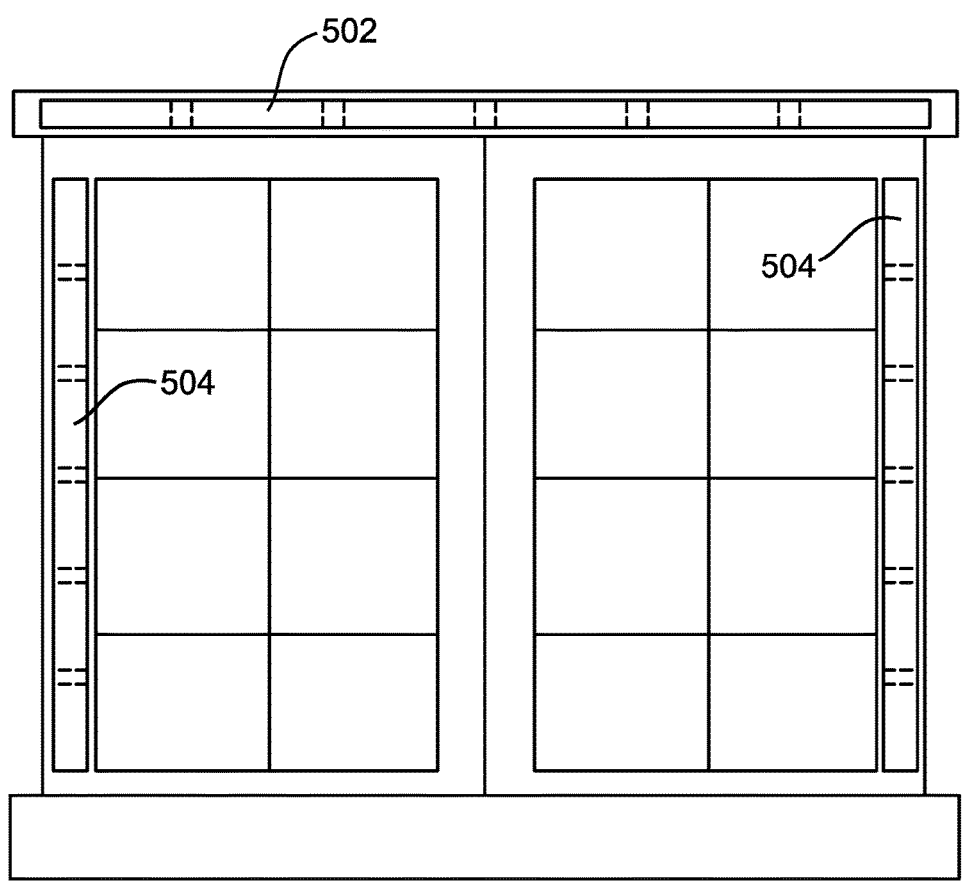
FIG. 5 illustrates an example of how the PV modules can be mounted to a window frame.

FIG. 5 illustrates an example of how the PV modules can be mounted to a window frame. A continuous row of interconnected PV modules 502 is shown horizontally above the window on the header frame. A continuous row of interconnected PV modules 504 is shown mounted vertically on the side window frame.

Figure 6:
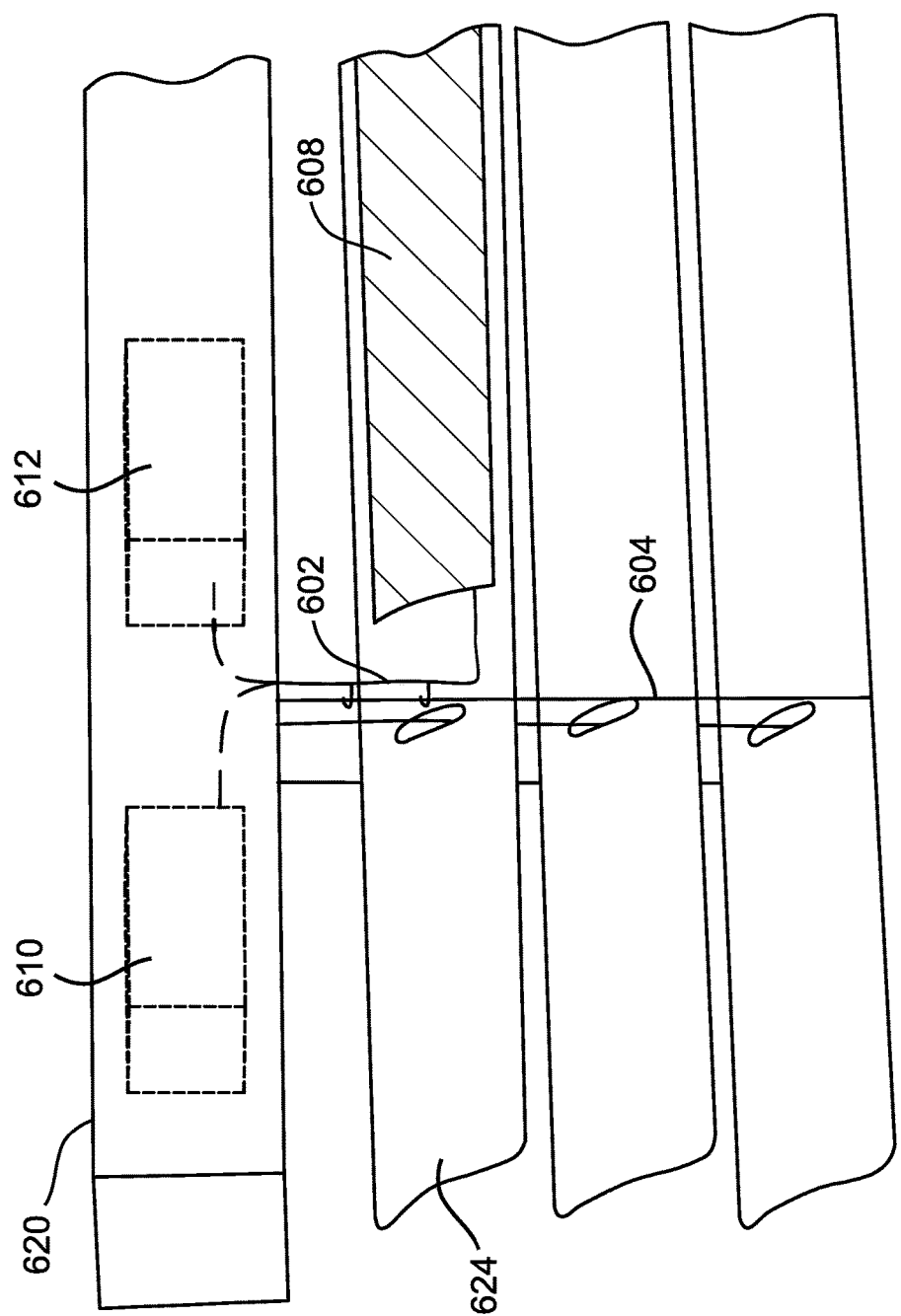
FIG. 6 shows a PV module mounted to the slat of a blind with wiring extending to the electrical components in the header of the blinds.

FIG. 6 shows a continuous row of interconnected PV modules 608 mounted on the blind slat 624. Interconnecting electrical wiring 602 extends from the PV modules 608 up to the electrical components 612 and energy storage devices 610, which are mounted inside the headrail 620. The interconnecting wiring 602 is flexible and is clipped onto the blind slat support string 604.

Figure 7B:
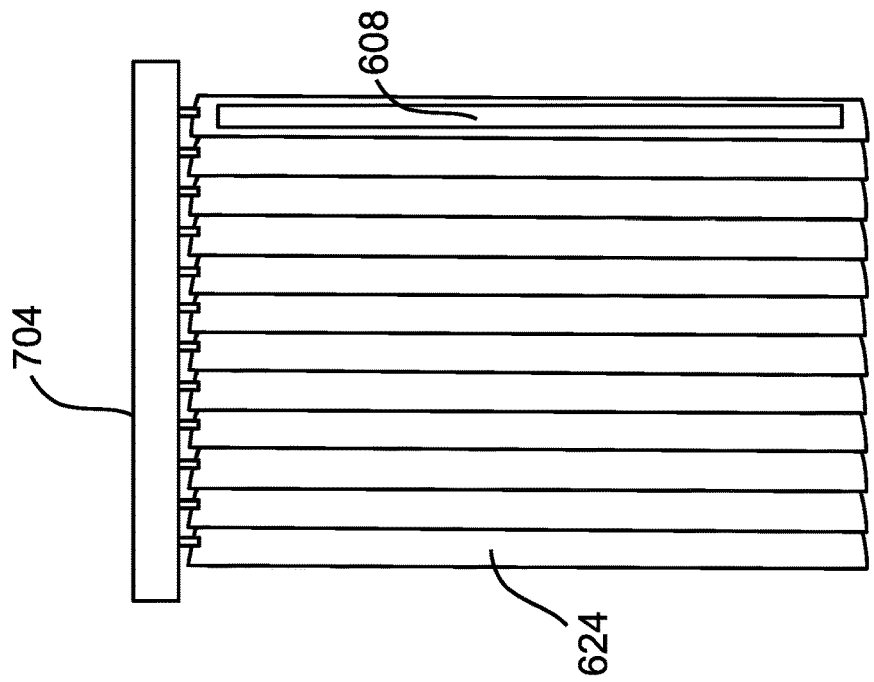
FIG. 7B illustrates an example of how PV modules are mounted to vertical blinds.
Figure 7A:
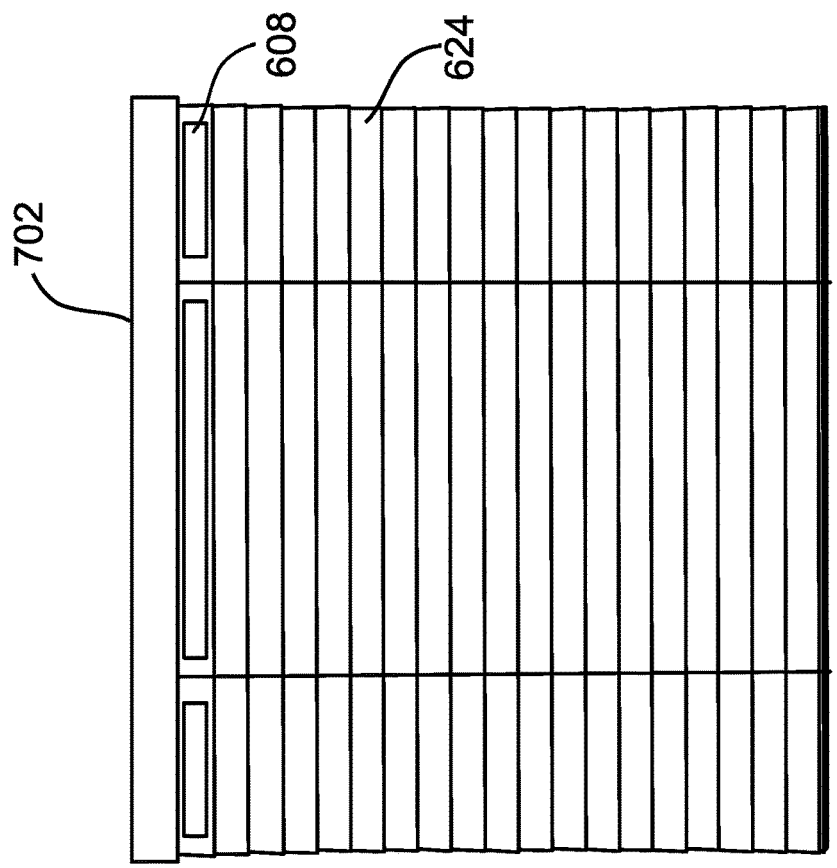
FIG. 7A illustrates an example of how PV modules are mounted to horizontal blinds.

FIG. 7A illustrates a continuous row of interconnected PV modules 608 mounted to the slats 624 of horizontal blinds 702.

FIG. 7B illustrates a continuous row of interconnected PV modules 608 is shown mounted to the slats 624 of vertical blinds 704.

Figure 8:
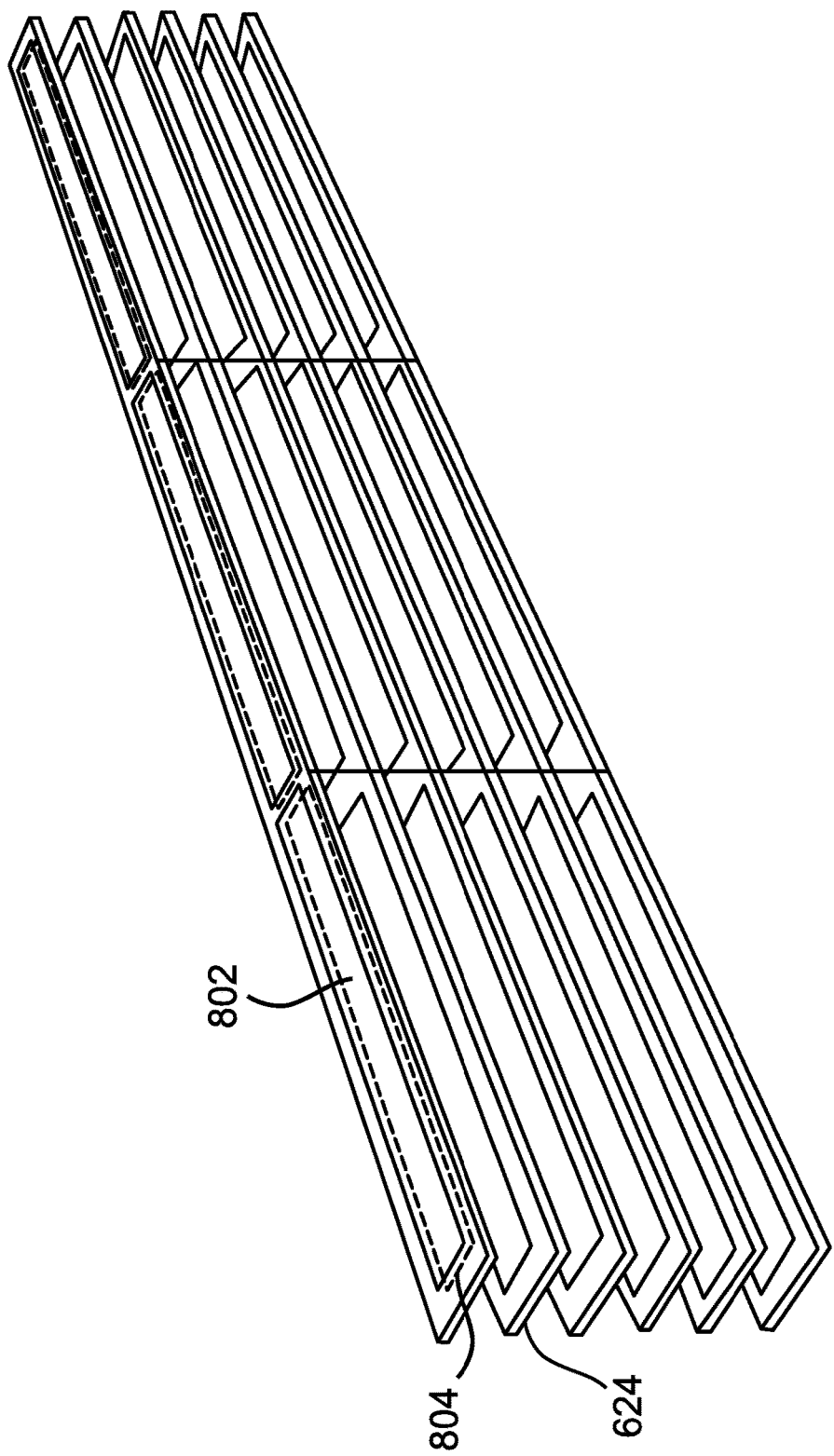
FIG. 8 illustrates an example of how the PV modules can be mounted to both sides of a blind slat.

FIG. 8 illustrates an example of how the PV modules can be mounted to both sides of a blind slat. A continuous row of interconnected PV modules 802 is mounted on the top of the blind slat 624. A continuous row of interconnected PV modules 804 is mounted on the bottom of the blind slat 624.

Figure 9:
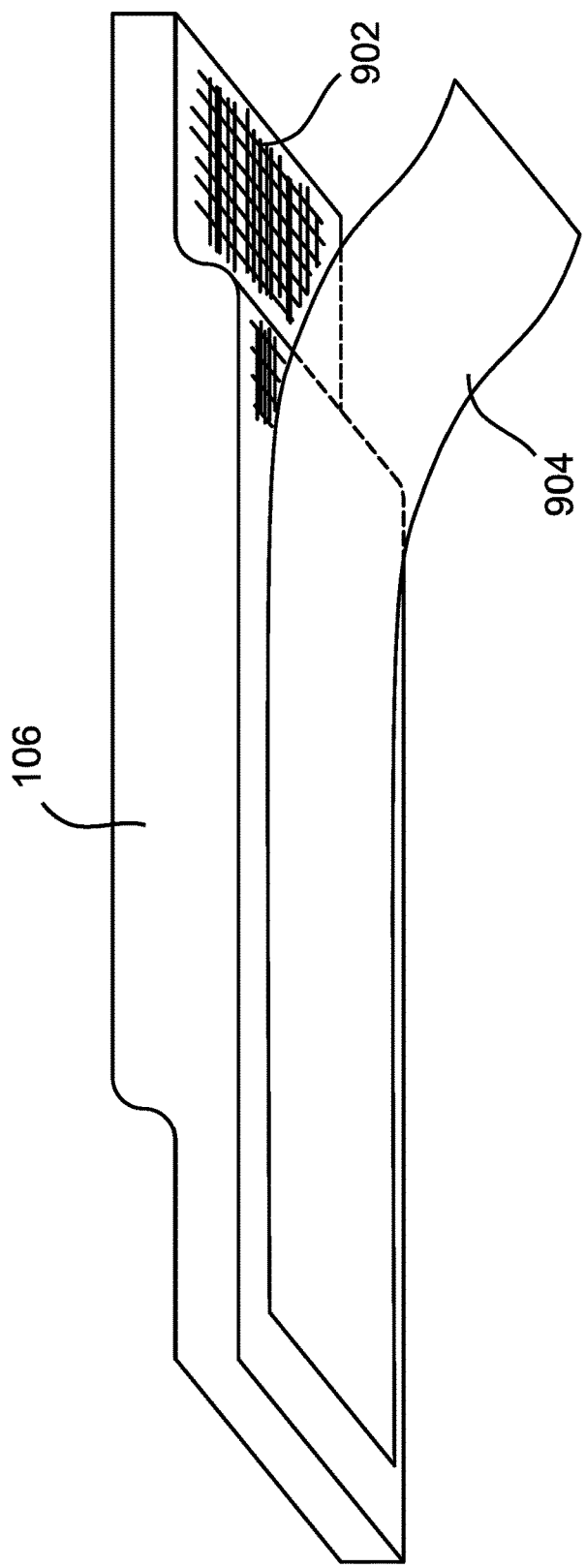
FIG. 9 is a perspective view of a PV module with the protective paper being peeled off of the adhesive backing.

FIG. 9 is a perspective view of a PV module with the protective paper being peeled off of the adhesive backing. PV module 106 is shown with adhesive material 902 on the back or bottom of the PV module. The protective paper backing material 904 is shown being peeled off to allow the installation of the PV module onto a smooth surface.

Figure 10A:
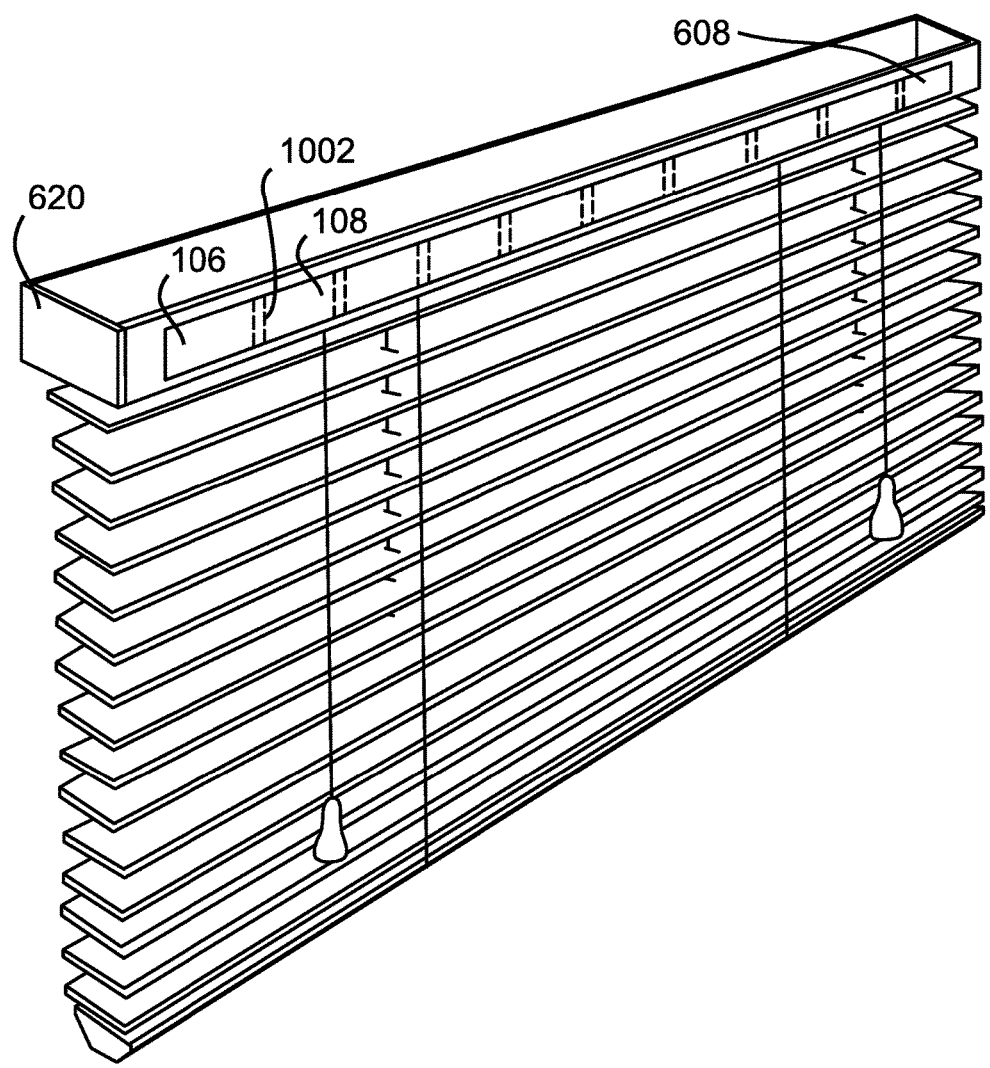
FIG. 10A is a perspective view of a set of horizontal blinds with PV modules shown overlapping each other on the header of the blinds.

FIG. 10A is a perspective view of a set of horizontal blinds with PV modules shown overlapping each other on the header of the blinds. A continuous row of interconnected PV modules 608 are mounted on the blind headrail 620. The overlapping of the two adjacent PV module 106 and PV module 108 is shown by the dashed lines 1002.

Figure 10B:
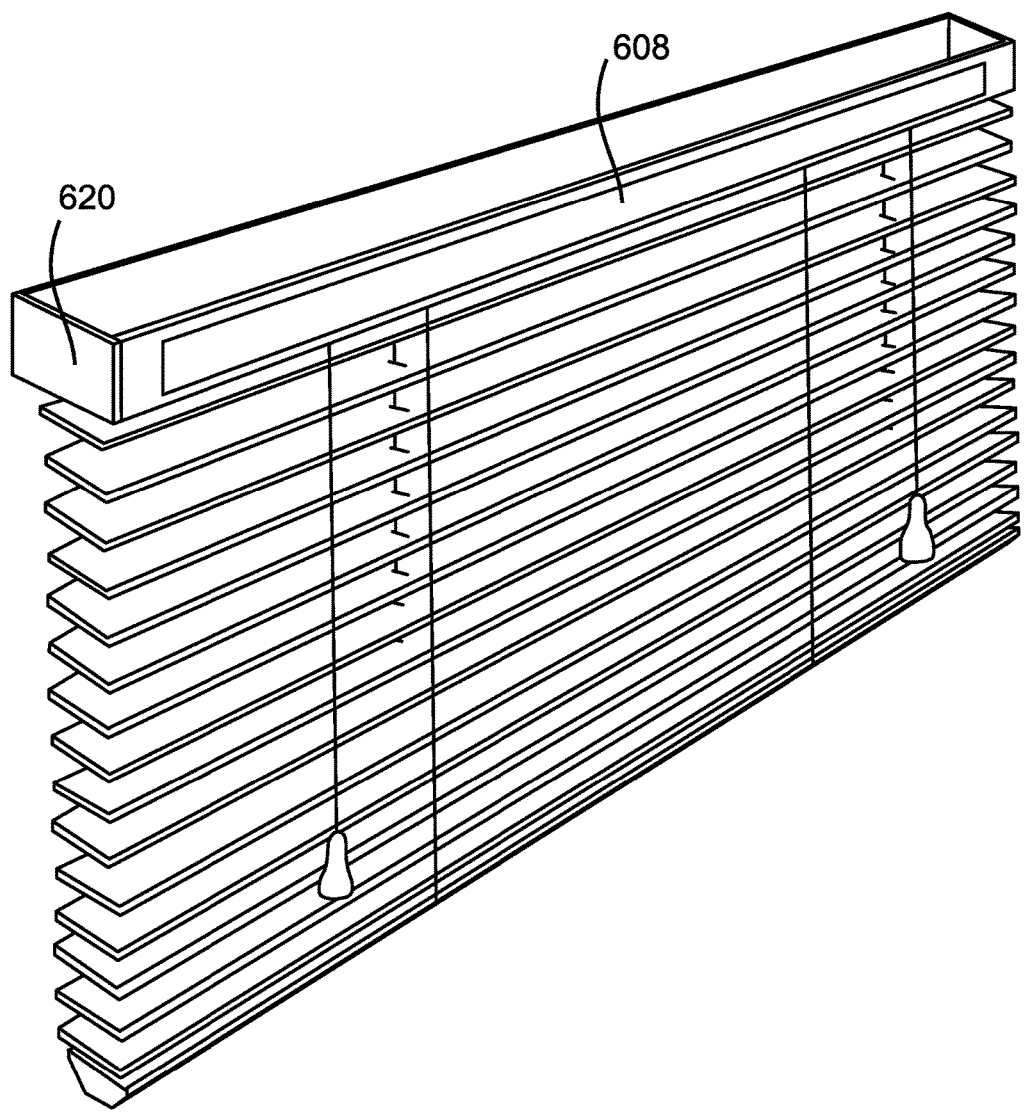
FIG. 10B is a perspective view of a set of horizontal blinds with PV modules on the header of the blinds.

FIG. 10B is a perspective view of a set of horizontal blinds with PV modules on the header of the blinds. A continuous row of interconnected PV modules 608 are mounted on the blind headrail 620. The plurality of PV modules visually appears as a continuous linear component across the entire length of the headrail.

Figure 11A:
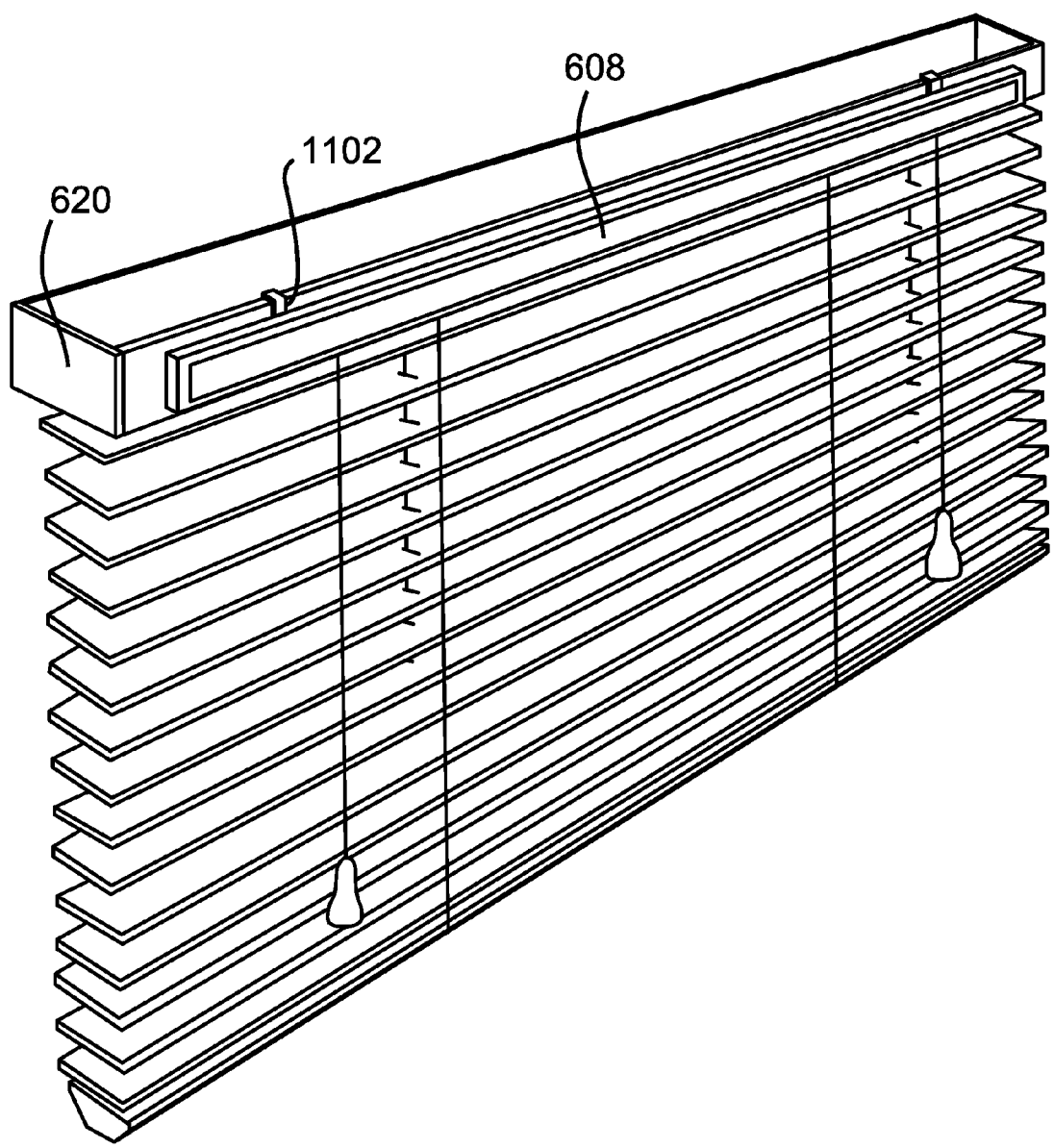
FIG. 11A is a perspective view of a set of horizontal blinds showing the adjustable mounting system with PV modules mounted at the header of the blinds.

FIG. 11A is a perspective view of a set of horizontal blinds showing the adjustable mounting system 1102 with a continuous row of interconnected PV modules 608 mounted on the headrail 620 of the blinds.

Figure 11B:
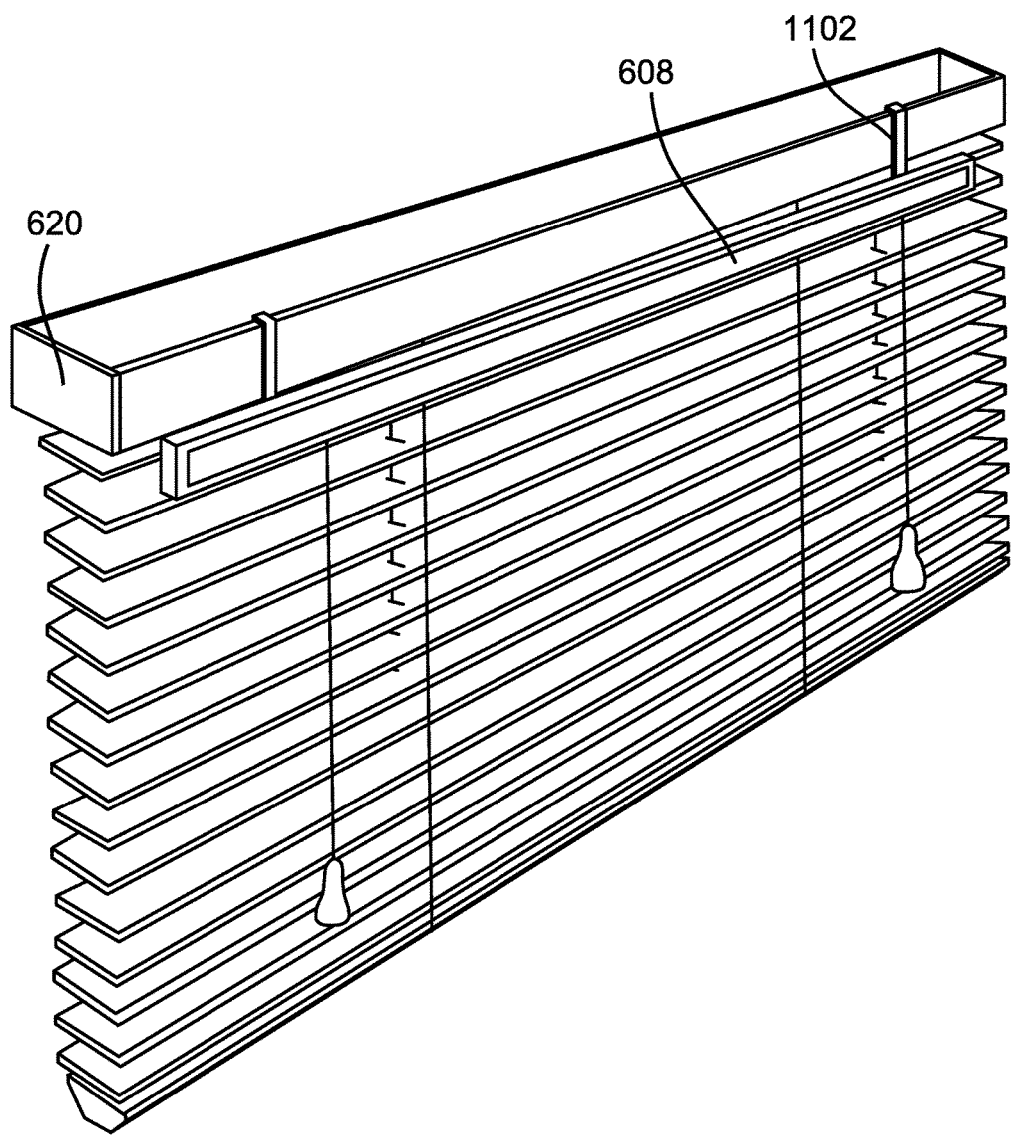
FIG. 11B is a perspective view of a set of horizontal blinds showing the adjustable mounting system with PV modules in a lower position below the header.

FIG. 11B is a perspective view of a set of horizontal blinds showing the adjustable mounting system 1102 with a continuous row of interconnected PV modules 608 in a lower position below the headrail 620.

Figure 12A:
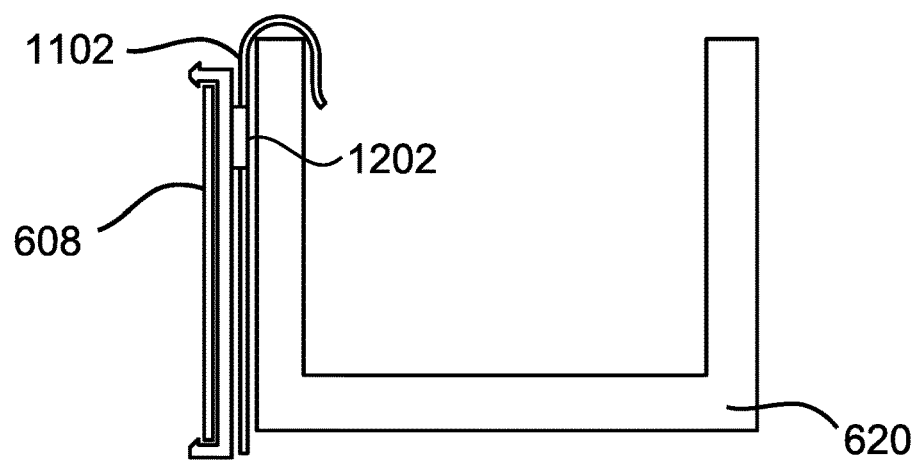
FIG. 12A is a side view of the adjustable mounting system showing the PV module in the high position near the header.

FIG. 12A is a side view of the adjustable mounting system 1102 showing a continuous row of interconnected PV modules 608 in the high position near the headrail 620. Locking mechanism 1202 retains the track in this high position.

Figure 12B:
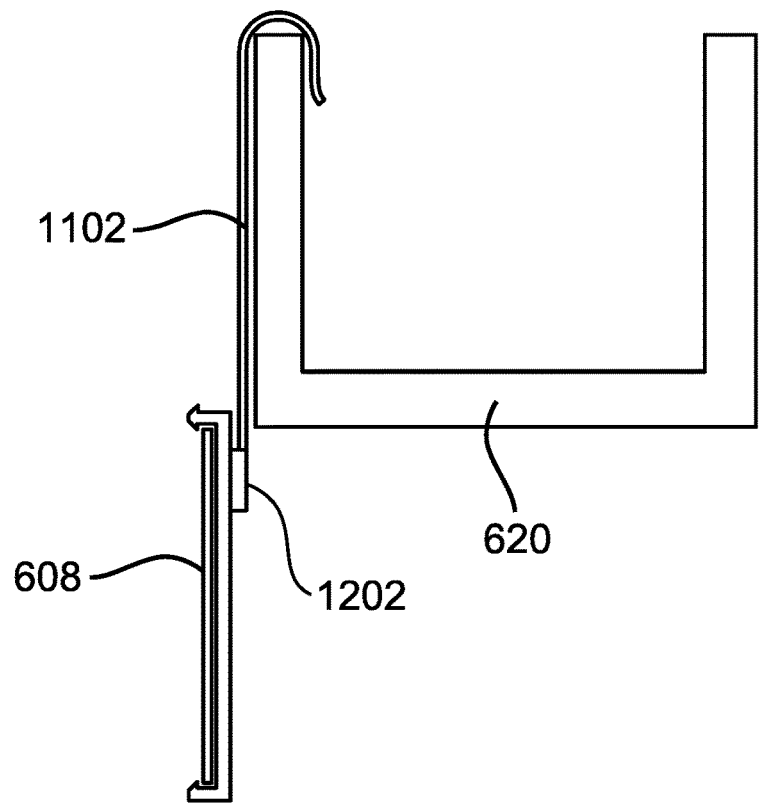
FIG. 12B is a side view of the adjustable mounting system showing the PV module in the low position extended down below the header.

FIG. 12B is a side view of the adjustable mounting system 1102 showing a continuous row of interconnected PV modules 608 in the low position below the headrail 620. Locking mechanism 1202 retains the track in the low position.

The invention claimed is:

1. A photovoltaic (PV) modular system comprising:
    two or more photovoltaic (PV) modules producing a current, each PV module comprising one or more photovoltaic cells;
    each of the two or more PV modules further comprising a plurality of contacts wherein the contacts couple the two or more PV modules together;
    the two or more PV modules further comprising embedded parallel wiring connecting the contacts to the cells and to a controller;
    the controller comprising electronics that bypasses one or more non-current producing PV modules allowing the current to pass through to the two or more PV modules;
    the two or more PV modules further comprising an encapsulation material enclosing the one or more photovoltaic cells, the plurality of contacts, the embedded parallel wiring, and the controller;
    wherein the contacts from a first PV module of the two or more PV modules are connected to the contacts of a second PV module of the two or more PV modules with a conductive adhesive;
    wherein the embedded parallel wiring of each of the two or more PV modules are rated to handle the combined electrical current of all of the interconnected two or more PV modules; and
    wherein the embedded parallel wiring connecting the two or more PV modules to at least one additional PV module through the plurality of contacts each PV module, providing interconnecting wiring for all connected three or more PV modules.

2. The contacts of claim 1, wherein the contacts from a first PV module are mechanically connected to a second PV module.

3. The PV modular system of claim 1, wherein the one or more PV modules are connecting and providing power to one or more electrical components.

4. The PV modular system of claim 3, wherein the one or more electrical components comprises a system for charging energy storage devices or components.

5. The PV modular system of claim 1, wherein the one or more PV modules are attached to a window covering system.

6. The PV modular system of claim 5, wherein the one or more PV modules are integrated into window covering components at a time of manufacture of a window covering system.

7. The PV modular system of claim 5, wherein the one or more PV modules are mounted to both a front and back side of blind slats within the window covering system.

8. The PV modular system of claim 5, wherein the connecting and providing power to one or more electrical components comprises flexible electrical wiring that clips onto a support or control string between blind slats.

9. The PV modular system of claim 5, wherein the one or more PV modules are provided with a mounting system connecting to a headrail of a window covering system that suspends the one or more PV modules at a lower level where they will receive more exposure to the sun.

10. The mounting system of claim 9, wherein the mounting system is adjustable and the one or more PV modules slide either up towards a headrail or down lower where they will receive more exposure to the sun, locking in to a specific position after being properly adjusted.

11. The PV modular system of claim 1, wherein one or more PV modules each has a full power rating of parallel wiring equal to or greater than a sum of maximum power production of a combined interconnected PV module assembly.

12. The PV modular system of claim 1, wherein electronic controls of the voltage and current of each PV module are incorporated into each PV module's internal circuiting.

13. The PV modular system of claim 1, wherein the embedded parallel wiring within the one or more PV modules provides an electrical pathway for both power and control functions.

14. The PV modular system of claim 1, comprising peel and stick adhesive backing to allow the one or more PV modules to be adhered to a surface.

15. The PV modular system of claim 1, wherein the one or more PV modules each comprises an extended encapsulation material allowing multiple one or more PV modules to overlap and not cover or shade any active solar portion of adjacent one or more PV modules.

* * * * *